(12) United States Patent
Laske et al.

(10) Patent No.: US 9,424,636 B2
(45) Date of Patent: Aug. 23, 2016

(54) METHOD FOR MEASURING POSITIONS OF STRUCTURES ON A MASK AND THEREBY DETERMINING MASK MANUFACTURING ERRORS

(71) Applicant: KLA-TENCOR CORPORATION, Milpitas, CA (US)

(72) Inventors: Frank Laske, Weilburg (DE); Mohammad M. Daneshpanah, Foster City, CA (US); Slawomir Czerkas, Weilburg (DE); Mark Wagner, Rehovat (IL)

(73) Assignee: KLA-Tencor Corporation, Milpitas, CA (US)

(*) Notice: Subject to any disclaimer, the term of this patent is extended or adjusted under 35 U.S.C. 154(b) by 0 days.

(21) Appl. No.: 14/643,610

(22) Filed: Mar. 10, 2015

(65) Prior Publication Data

US 2015/0248756 A1    Sep. 3, 2015

Related U.S. Application Data

(63) Continuation of application No. PCT/US2014/069348, filed on Dec. 9, 2014.

(60) Provisional application No. 61/919,709, filed on Dec. 21, 2013.

(51) Int. Cl.
  *G06K 9/00*    (2006.01)
  *G06T 7/00*    (2006.01)
  *G03F 1/84*    (2012.01)

(52) U.S. Cl.
  CPC ............... *G06T 7/001* (2013.01); *G03F 1/84* (2013.01); *G06T 2207/30148* (2013.01)

(58) Field of Classification Search
  CPC ..... G06T 7/0004; G06T 7/004; G06T 7/003; G06T 7/001; G06T 7/602; G06T 7/0044; G06T 7/204; G06T 2207/10004; G06T 2207/30148; G03F 7/70775; G03F 7/70716; G03F 7/70633; G03F 1/84; G03F 1/64
  USPC ........................................................ 382/144
  See application file for complete search history.

(56) References Cited

U.S. PATENT DOCUMENTS 8,458,623 B1 * 6/2013 Wagner ................ G03F 1/36
                                                                716/51
9,201,312 B2   12/2015 Eyring et al.
(Continued)

FOREIGN PATENT DOCUMENTS

DE     102008060293    6/2010

OTHER PUBLICATIONS

Nakayamada, Noriaki, et al. "Modeling of charging effect and its correction by EB mask writer," Proc. of SPIE vol. 7028, 70280C-1 through 70280C-12, 2008, http://proceedings.spiedigitallibrary.org on Apr. 12, 2016.

*Primary Examiner* — Ali Bayat
(74) *Attorney, Agent, or Firm* — Simpson & Simpson, PLLC

(57) ABSTRACT

The invention discloses a method for measuring positions of structures on a mask and thereby determining mask manufacturing errors. It is shown, that from a plurality measurement sites an influence of an optical proximity effect on a position measurement of structures on the mask, is determined with a metrology tool. A rendered image of the data representation of the structures is obtained. Additionally, at least one optical image of the pattern within the area on the mask is captured with the imaging system of the metrology tool. The field of view of the metrology tool is approximately identical to the size of the selected area of the mask design data. Finally, a residual is determined, which shows the manufacturing based proximity effect.

13 Claims, 11 Drawing Sheets

(56) References Cited

U.S. PATENT DOCUMENTS

| | | | |
|---|---|---|---|
| 9,316,917 B2* | 4/2016 | Arai | G03F 7/7015 |
| 2001/0055416 A1 | 12/2001 | Yamashita | |
| 2003/0121021 A1 | 6/2003 | Liu et al. | |
| 2004/0146808 A1* | 7/2004 | Dirksen | G03F 1/144 |
| | | | 430/311 |
| 2005/0177809 A1* | 8/2005 | Kamat | G03F 1/30 |
| | | | 430/5 |
| 2006/0192310 A1* | 8/2006 | Lindacher | B29D 11/00125 |
| | | | 264/1.32 |
| 2007/0023942 A1* | 2/2007 | Andino | B29C 35/0805 |
| | | | 264/1.32 |
| 2008/0202201 A1* | 8/2008 | Boesser | G01B 21/045 |
| | | | 73/1.79 |
| 2008/0247632 A1 | 10/2008 | Boehm et al. | |
| 2009/0119635 A1 | 5/2009 | Takahata | |
| 2010/0074511 A1* | 3/2010 | Tamamushi | B82Y 10/00 |
| | | | 382/141 |
| 2010/0245761 A1* | 9/2010 | Widman | G02B 1/043 |
| | | | 351/159.41 |
| 2011/0229010 A1 | 9/2011 | Arnz et al. | |
| 2012/0063666 A1 | 3/2012 | Arnz et al. | |
| 2014/0086475 A1 | 3/2014 | Daneshpanah et al. | |
| 2014/0307949 A1* | 10/2014 | Eyring | G03F 7/70633 |
| | | | 382/151 |

* cited by examiner

METHOD FOR MEASURING POSITIONS OF STRUCTURES ON A MASK AND THEREBY DETERMINING MASK MANUFACTURING ERRORS

CROSS REFERENCE TO RELATED APPLICATIONS

This application is filed under 35 U.S.C. §120 and §365(c) as a continuation of International Patent Application Serial No. PCT/US14/69348, filed on Dec. 9, 2014, which application claims the benefit under 35 U.S.C. 119(e) of U.S. Provisional Patent Application No. 61/919,709, filed on Dec. 21, 2013, which applications are incorporated herein by reference in their entirety.

FIELD OF THE INVENTION

The present invention refers to method for measuring positions of structures on a mask and thereby determining mask manufacturing errors.

BACKGROUND OF THE INVENTION

Position measurements of targets, in particular of structures on substrates in semiconductor manufacturing, are subject to various types of errors. Precise determination of the position of structures is important to assure that, ultimately, correctly functioning semiconductor products, like computer chips, for example, are produced. The demands with respect to precision increase as the structure dimensions on the chips to be produced decrease.

An important aspect of position measurements in the above context is registration of structures or sections of a structured surface with respect to each other. Errors of registration on a mask as determined by a measurement with a typical optical metrology tool, of which KLA-Tencor's LMS IPRO 5 is a contemporary example, may for example be due to errors in the optical metrology tool or to errors in the mask writer. By eliminating or reducing the errors occurring in the measurement with the optical metrology tool, the errors due to the mask writer can be identified.

For example, German published patent application DE 10 2008 060 293 A1 and US published patent application US 2011/0229010 A1 disclose a method for determining relative positioning errors of plural sections of structures written on a substrate like a wafer or a photolithography mask. One magnified image of a region of the substrate larger than one section is recorded. Position errors of measurement marks contained in the image are determined from the image. The position errors are corrected for errors due to the imaging process. From the position errors corrected in this way the relative position error of the section is derived. This relative position error of a section is also known as stitching error, and the method assumes that errors due to the imaging process produce low frequency errors, whereas the stitching errors produce high frequency errors. Therefore, in order to remove the imaging errors, the low frequency error components are removed by a high-pass filtering process.

Another approach is to measure each target in an array of targets, for example each structure of interest in an arrangement of structures on a surface of a semiconductor substrate, individually, by moving the respective target into the center of the field of view of an imaging system of an optical metrology tool and performing the measurement.

The multi-region-of-interest registration measurement is a further approach. This makes use of the fact that often many targets are simultaneously contained in the field of view of an imaging system of an optical metrology tool. So the positions of plural targets, located at different positions relative to the field of view, can be measured at the same time.

However, the assumption made in the prior art about the mask writer having only high frequency errors is not strictly correct. By the high-pass filtering process information on the low frequency mask writer error therefore is discarded. In the case of individual target measurements, the throughput is very low. For example, on an IPRO4 metrology tool, measuring a single target may take up to 12 seconds, and measuring a typical array then up to 7 hours. During this long period of time, drift errors of the metrology tool can occur, which reduce the precision of the results.

In the multi-region-of-interest approach, due to optical distortion and aberrations which depend on the position of the structure to be measured in the field of view, different registration results may be produced. For example an array of targets like a mask with structures is shifted relative to the field of view and the position, relative to the array, or mask, respectively, is determined for each shifted position. The error depends on the field-of-view coordinates, is also referred to as field-varying error, and limits the achievable precision of registration measurements.

The optical error, like for example the optical distortion and/or aberrations, depends on the optical setup of the imaging system, but may also depend on parameters of the measured targets/structures, like size or symmetry of the targets, or on proximity effects caused by two or more targets. The optical error can further depend on the substrate on which an array of targets is provided in specific technical fields, like in the case of wafers or masks in semiconductor manufacturing. There, the optical error can for example depend on the coatings, layer design or layer thickness of a mask.

BRIEF SUMMARY OF THE INVENTION

It therefore is an object of the invention to provide a cost- and time-efficient method for separating optical mask registration proximity errors from pattern dependent, mask manufacturing registration errors.

This object is achieved by a method for measuring positions of structures on a mask and thereby determining mask manufacturing errors comprising the following steps: determining from a plurality of measurement sites an influence of an optical proximity effect on a position measurement of structures on the mask, with a metrology tool: selecting an area on the mask from mask design data which contain a data representation of the structures to be measured by the metrology tool; carrying out an image rendering of the data representation of the structures, wherein at least one rendered image of the mask design data is obtained; moving a measuring table of the metrology tool in a plane parallel to a surface of the mask and thereby placing an area of the mask in a field of view of an imaging system of the metrology tool, wherein the area of the mask is located at a position on the mask which corresponds to a position of the area selected from mask design data; capturing at least one optical image of the pattern within the area on the mask with the imaging system of the metrology tool; and determining a residual from the at least one rendered image of the structures according to the mask design data and the at least one optical image of the structures on the specific area on the mask.

The advantage of the invention is that the optical proximity effect can be neglected in case a model-based algorithm is used. The correction of the proximity effect does no longer require a reference metrology tool, such as an AFM or a SEM.

The proximity effect is caused by the finite resolution of optical mask registration metrology tools and gives rise to apparent shifts in the position of patterns that are extremely hard to measure and to separate from real mask shifts based on the mask manufacturing process. The apparent shifts can be several nm, several times larger than the accuracy requirement of <1 nm for nodes below 20 nm half pitch.

The influence of the optical proximity effect on the position measurement of structures on the mask is determined. Accordingly an image rendering of a data representation (mask design data) of each of at least two structures or measurement sites is carried out. Then at least one rendered image of the mask design data of the at least two measurement sites or structures is obtained. Additionally, at least one optical image is captured of the at least two measurement sites or structures on the mask, wherein the location of measurement sites on the real mark corresponds to the location of the measurement sites defined by the mask design data. The field of view of the measurement objective has approximately the same size as the area of the mask design data which encompass the measurement sites. Finally, the rendered image is subtracted from the captured optical image, which does not include the average optical proximity effect in the X-direction and in the Y-direction. As a result one recognizes that the influence of the optical proximity effect can be neglected.

The influence of the optical proximity effect on a position measurement is determined with the metrology tool from at least one arrangement of measurement sites. In general the arrangement of measurement sites is a contact array and has a symmetry. According to this special arrangement a first measurement site is surrounded by identical sites, and at least a second measurement site and at least a third measurement site are located at opposite edges of the arrangement of measurement sites.

According to a further embodiment of the invention the influence of the optical proximity effect is determined with the use of an arrangement of measurement sites which has one first central measurement site, and a second measurement site, a third measurement site, a fourth measurement site, and a fifth measurement site. The second measurement site, the third measurement site, the fourth measurement site, and the fifth measurement site are positioned at corners of the arrangement of measurement sites and do have a different symmetry compared to the first and central measurement site.

A plurality of arrangements of measurement sites can be formed on a test mask in a plurality of dies. Additionally, it is conceivable that a plurality of dies is formed on a production mask, wherein some of the dies carry an arrangement of measurement sites. According to one possible embodiment the arrangement of measurement sites is a contact array.

The image rendering of a mask design data area with contains the selected structures is carried out as well on the mask design data area which is rotated by 180°. Additionally, the capturing of at least one image of a field of view, which corresponds to the mask design data area, is carried out as well with a 180°-rotated mask.

The residual is an arithmetic average of a difference between at least one rendered image and at least one corrected optical image. In general a stack of rendered images and a stack of corrected optical images are applied. The residual is a color-coded graphical representation of a deviation of the position of the structures in the X-direction and the Y-direction of the mask coordinate system between the at least one rendered image and the at least one optical image. The displayed field of view of the residual shows the deviation which is purely based on mask manufacturing errors. The optical proximity error does not have any influence if the position of the structure is measured with an edge based algorithm.

The edge based algorithm involves acquiring an optical image of a functional pattern on a mask (photomask). Additionally, a simulation of an expected image is applied by using a model of the imaging system and design data of the mask. A database describes the mask pattern or the measurement sites. Registration or position measurement is computed by minimizing a metric of dissimilarity, or equivalently, maximizing a metric of similarity of the acquired optical image and the simulated image (rendered image). For example, a metric of dissimilarity of two images are the pixel-by-pixel differences of two images. A metric of similarity of two images is their correlation. In the preferred implementation, multiple images at different focus settings are acquired and multiple rendered images are generated from the mask design data. The difference of the optical and rendered images is computed for each pixel and each focus value. In an embodiment, the registration mismatch for each measurement site is simultaneously computed with other parameters such as focus. In an embodiment, the model of the imaging system includes aberrations.

The general flow of the measurement using the model-based algorithm is as follows:

A. A user chooses the measurement sites while having control over the pattern spacing, choice of using similar or non-similar in-die patterns as well as standard targets. The algorithm can search the database for suitable patterns for which measurement uncertainty is small and sort/suggest the list for the user.

B. A through-focus image stack is captured at the measurement site while recording stage position and focus sensor data of the metrology tool.

C. Optical images are corrected for CCD nonlinear response (shading) as well as field distortion of the measuring objective. Distortion shall be calibrated through focus to account for magnification and telecentricity error and to increase registration accuracy.

D. From a database, a mask pattern within one or more measurement fields in the field of view (FOV) is extracted with an additional margin to allow for calculating optical proximity effects. E. The through-focus stack corresponding to each measurement field is extracted.

F. The test image corresponding to the measurement site is computed based on data from the database and optical parameters such as wavelength, numerical aperture (NA) and pixel size. Aberrations of the optical system are measured offline and are included in the image calculation. Apodization of the objective is included in the image calculation.

G. A minimization problem is solved for each measurement field so that the L2-norm of the difference between optical and rendered image stack is minimized as a function of registration in X-direction and Y-direction and global focus position for the image stack, i.e. a least-square minimization with registration in X-direction, registration in Y-direction and global focus position as parameters is done.

H. The computed registration result from step (f) is reported for each measurement field.

BRIEF DESCRIPTION OF THE DRAWINGS

Below the invention and its advantages will be further described with reference to the accompanying schematic drawings, in which.

DETAILED DESCRIPTION OF THE INVENTION

Figure 1:
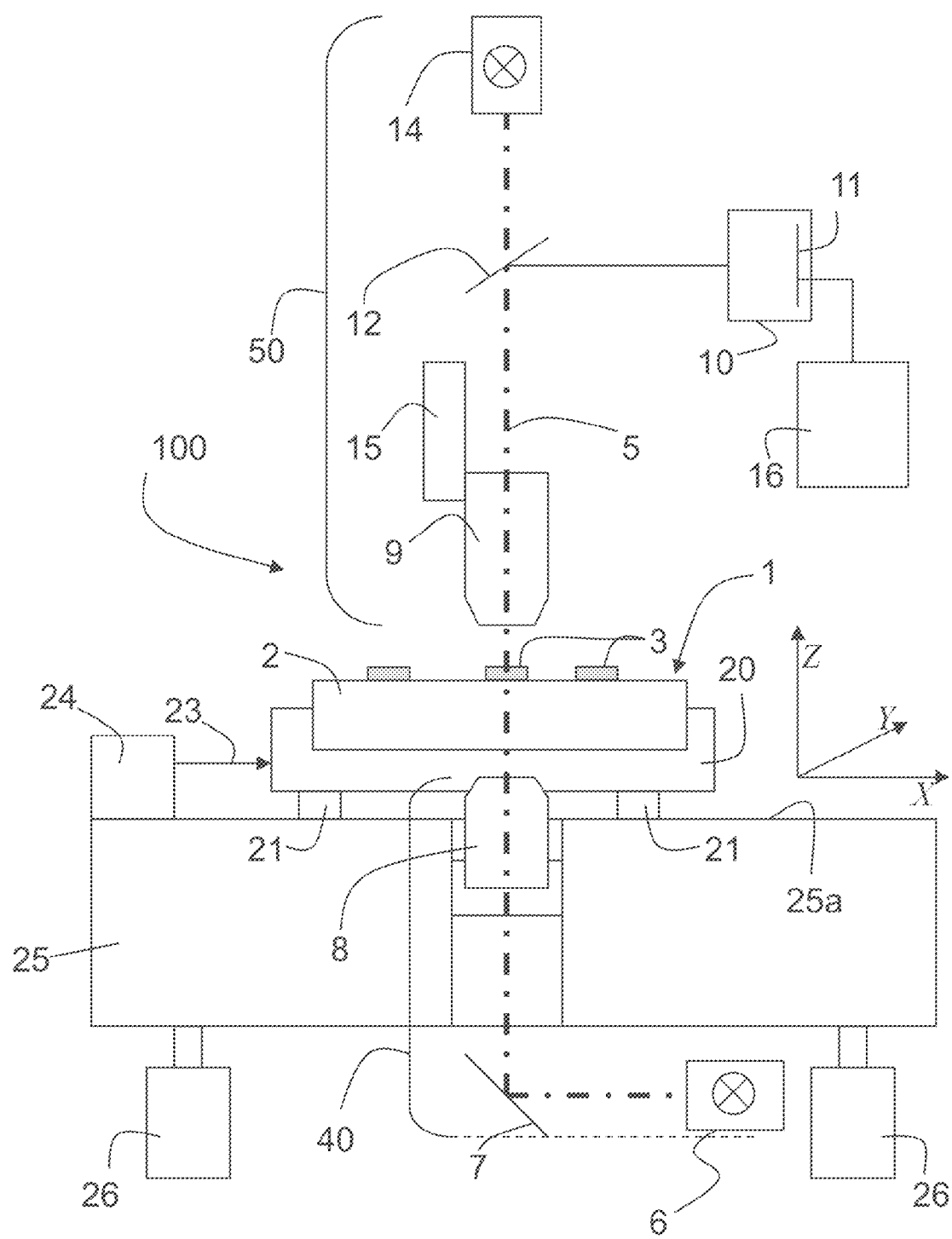
FIG. 1 is a schematic setup of a prior art mask registration metrology tool.

In the figures like reference numerals are used for like elements or elements of like function. Furthermore, for the sake of clarity, only those reference numerals are shown in the figures which are necessary for discussing the respective figure.

FIG. 1 shows a schematic representation of a coordinate measuring machine or metrology tool 100 as has long been known from the prior art. The metrology tool 100 shown here is only one example of an apparatus which can be used to perform the methods according to the invention. In no way are the methods according to the invention limited to the specific configuration of such a metrology tool 100 shown in the figure. What is important for the inventive method is that the metrology tool 100 is able to perform relative shifts between a mask and a field of view defined. More precisely the field of view is defined by an imaging system of the metrology tool 100. The field of view is such that a plurality of structures on the mask is contained therein. The metrology tool 100 is able to determine the positions of these structures.

A metrology tool 100 is used, for example, for determining the width (CD—critical dimension) of a structure 3 on a substrate 2. Also, using the metrology tool 100, the position of at least one structure 3 on the substrate 2 can be determined. The substrate 2 may for example be a wafer with a structured surface or a mask 1 exhibiting structures 3, to be transferred to a wafer by a photolithography process. Although the metrology tool 100 shown in FIG. 1 has long been known from prior art, for the sake of completeness, the operation of the metrology tool 100 and the arrangement of the individual elements of the metrology tool 100 will be discussed.

The metrology tool 100 comprises a measuring table 20, which is arranged so as to be displaceable on air bearings 21 in a plane 25a in the X-coordinate direction and in the Y-coordinate direction. Types of bearings other than air bearings can also be used to move the table in the X-coordinate direction and in the Y-coordinate direction. The plane 25a is defined by one massive element 25. In a preferred embodiment, the massive element 25 is a formed granite block. However, to a person skilled in the art, it is obvious that the element 25 can be made from a different material which provides a precise plane for the displacement of the measuring table 20. The position of the measuring table 20 is measured by means of at least one laser interferometer 24. To carry out the measurement, the at least one laser interferometer 24 emits a light beam 23 which hits the measuring table 20. From the position of the measuring table 20 the position of the mask 1 can be determined. In particular, the position of the mask 1 relative to a field of view is determined. The element 25 itself is mounted on oscillation dampers 26 in order to prevent for example building oscillations reaching the device.

The mask 1 can be illuminated with a transmitted light illumination system 6 and/or a reflected light illumination system 14. The transmitted light illumination system 6 is provided in an optical arrangement 40. The reflected light illumination system 14 is also provided in an optical arrangement 50. The optical arrangement 40 comprises the transmitted light illumination system 6, a deflecting mirror 7, and a condenser 8. By means of the deflecting mirror 7 the light from the transmitted light illumination system 6 is directed to the condenser 8. The further optical arrangement 50 comprises the reflected light illumination system 14, a beam-splitting mirror 12, the measuring objective 9 and a displacing device 15 of the measuring objective 9. Using the displacing device 15 the measuring objective 9 can be displaced in the Z-coordinate direction (e.g. for focusing). The measuring objective 9 collects light coming from the mask 1, and the light is then deflected out of the reflected light illumination axis 5 by means of the partially transparent deflecting mirror 12. The light passes to a camera 10 which is provided with a detector 11. The detector 11 is linked to a computer system 16 which generates digital images from the measurement values determined by the detector 11. The computer system 16 carries out all the calculations which are necessary to determine the position of the structure 3 or structures 3 on the mask 1.

In particular, the field of view is defined by the measuring objective 9, the camera 10 and the detector 11 of the camera 10 of the metrology tool 100. The imaging system of the metrology tool 100 mainly comprises the measuring objective 9, the camera 10 and the detector 11.

Figure 2:
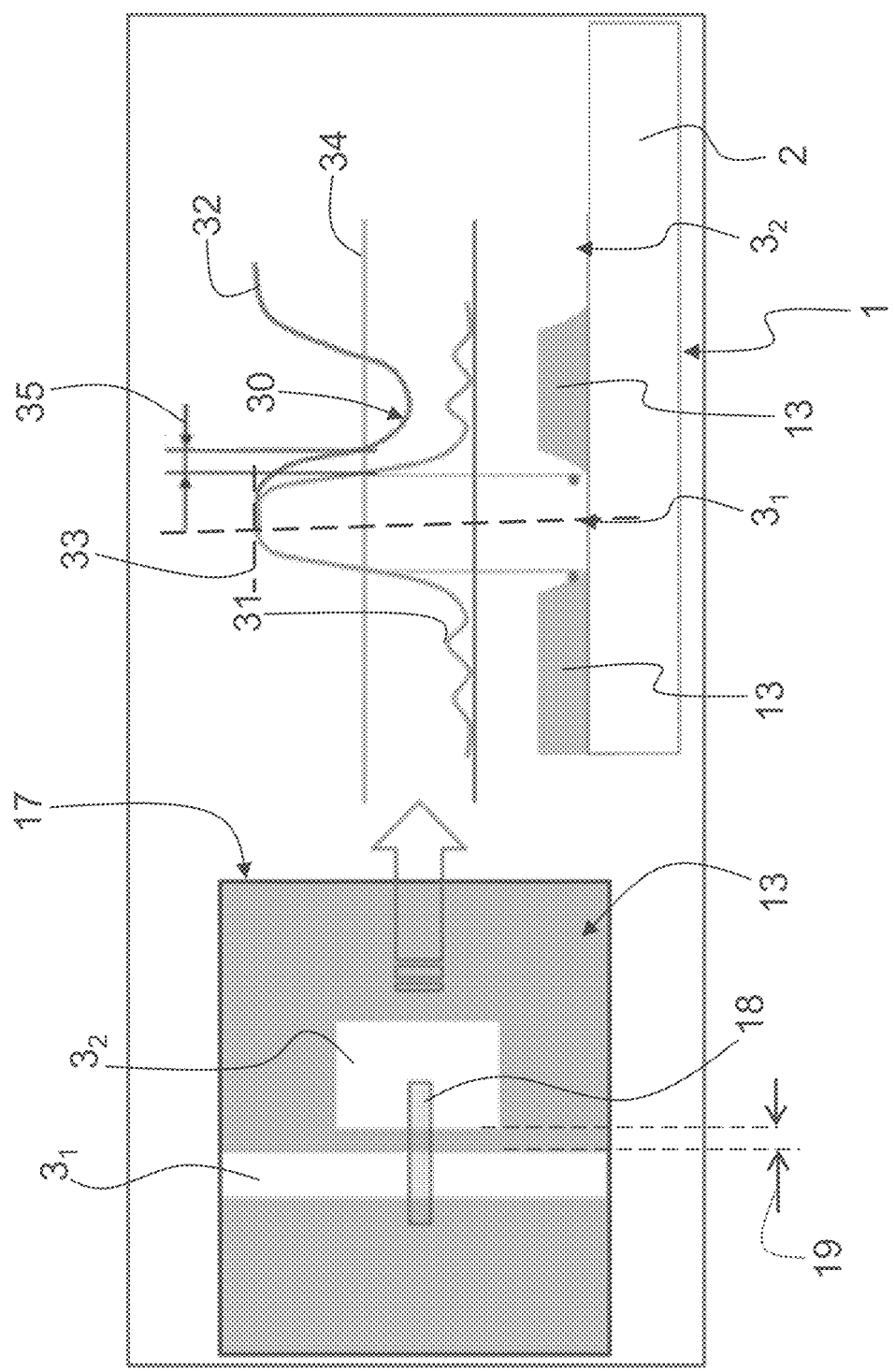
FIG. 2 is a schematic representation of structures on a mask/substrate which cause a pattern shift, known as the "proximity effect"

FIG. 2 shows a schematic representation of a first structure $3_1$ and a second structure $3_2$ on a mask 1 which causes a pattern shift ΔP, known as the "proximity effect". As shown in FIG. 2, the mask 1 is a quartz substrate 2 which carries a chromium layer. The chromium layer 13 is structured in order to form the individual structures 3 on the surface of the substrate 2. In the example shown here, the first structure $3_1$ and the second structure $3_2$ are in a field of view 17 of the measuring objective 9. The field of view 17 is imaged onto the detector 11 of the camera 10. The detector 11 configured as a CCD-sensor and defines a measurement window 18, which stretches across the first structure $3_1$ and partly across the second structure $3_2$. The first structure $3_1$ and the second structure $3_2$ are separated by distance 19. The smaller the distance 19 between the first structure $3_1$ and the second structure $3_2$, the greater the influence of the proximity effect gets.

FIG. 2 shows as well the overall electronic signal 30 registered from the measurement window 18. The overall electronic signal 30 is a superposition of an electronic signal 31 from the first structure $3_1$ and an electronic signal 32 from the second structure $3_2$. The determination of the position or the width of the first structure $3_1$ is carried out by looking at a half value 34 of the registered maximum value 33 of the overall electronic signal 30. From the overall electronic signal 30 one obtains a pattern shift 35 of the first structure $3_1$. Consequently the first structure $3_1$ seems to be broader than if measured without the presence of the second structure. The second structure $3_2$ is subjected to a pattern shift (not shown) as well. The finite resolution of an optical mask registration metrology tool 100 gives rise to apparent shifts in the position or width of structures. These apparent shifts are extremely hard to measure and almost impossible to separate from real mask shifts. The apparent shifts, known as the "proximity effect", can be several nm, several times larger than the accuracy requirement of <1 nm of the metrology tool 100 for nodes below 20 nm half pitch.

Figure 3:
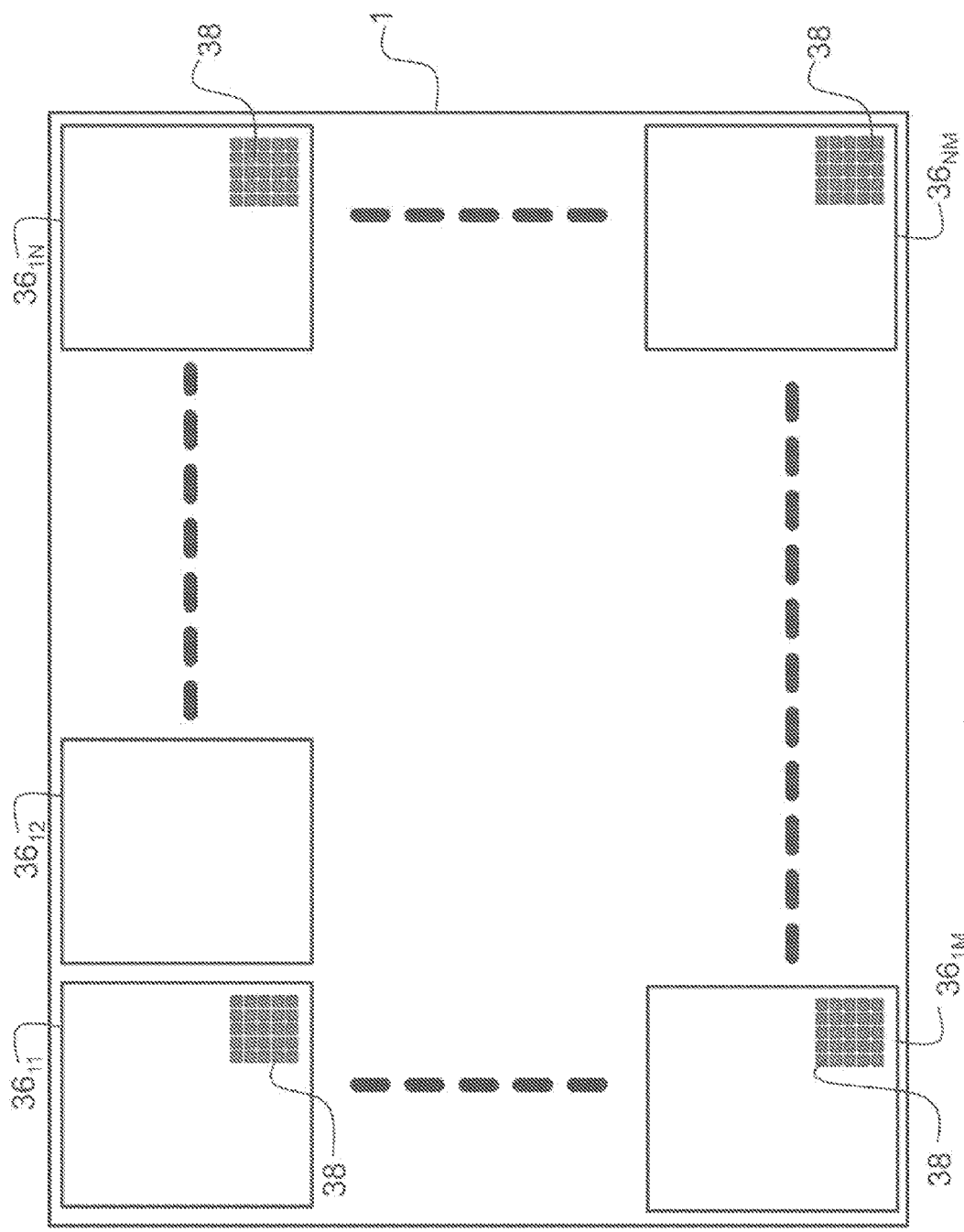
FIG. 3 is a schematic representation of a mask which contains a plurality of dies.

FIG. 3 shows a schematic representation of a mask 1 which contains a plurality of dies $36_{11}$, $36_{12}$, . . . ,$36_{NM}$. Some or all of the dies $36_{11}$, $36_{12}$, . . . ,$36_{NM}$ have an arrangement of measurement sites 38. According to an embodiment of the invention, the arrangement of measurement sites 38 is an array of contacts. The mask can also be a special test mask (not shown). The test mask has an array of dies. Each die of the array has several different dense contact arrays. The contact arrays differ by contact size and pitch.

Figure 4:
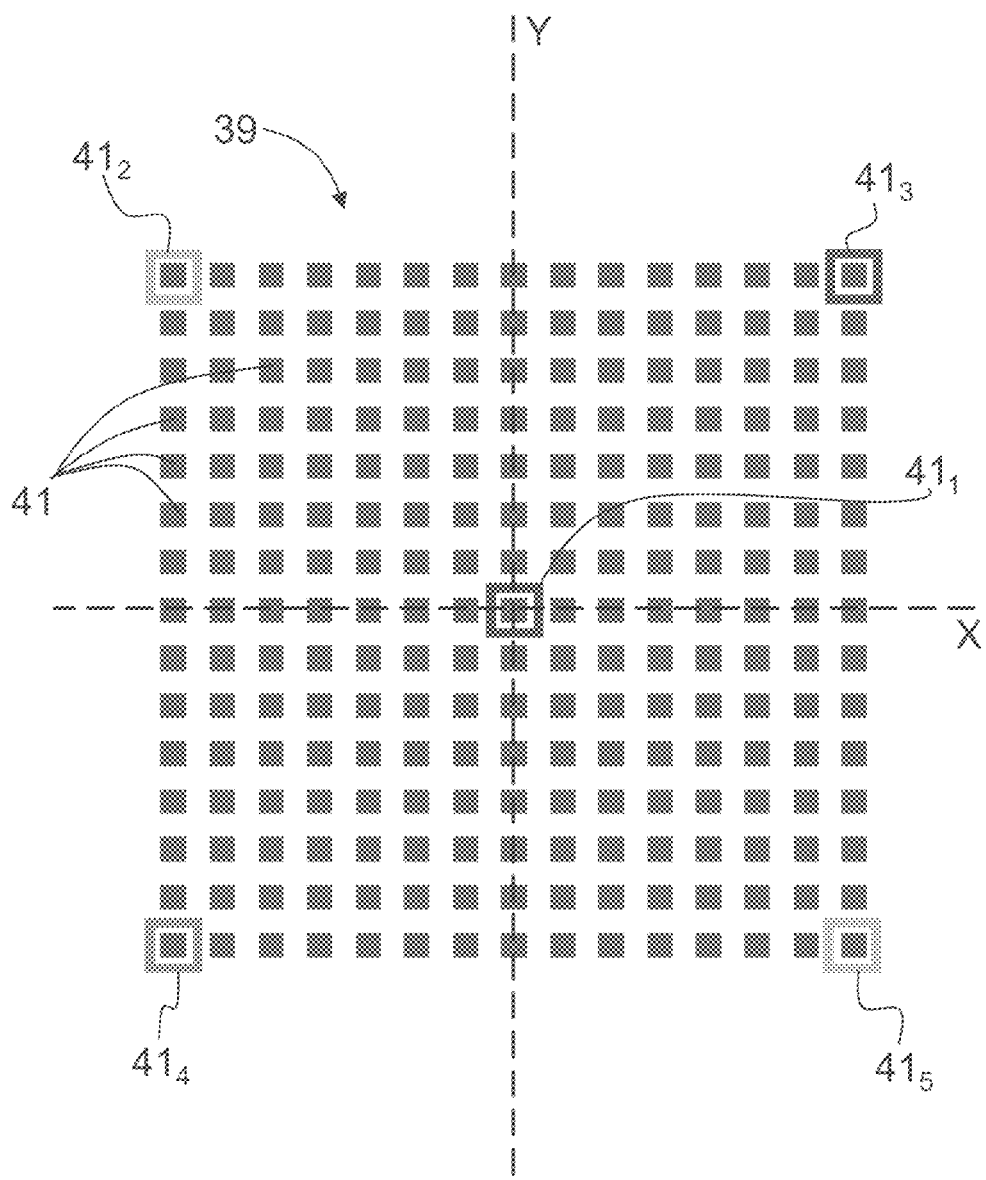
FIG. 4 is a plan view of a possible contact array on a mask, with four measurement sites positioned at the corners of the contact array.

FIG. 4 shows a plan view of a possible contact array 39 on a mask (not shown here), which stretches along the X-direction and the Y-direction. A plurality of measurement sites 41 are arranged in the form of the contact array 39. The example of the contact array 39 shown here might appear 15×15 times on the mask. With optical metrology tool 100, a first measurement site $41_1$, a second measurement site $41_2$, a third measurement site $41_3$, a fourth measurement site $41_4$ and a fifth measurement site $41_5$ of the plurality of measurement sites 41 of the contact array 39 are used for the measurement of the proximity effect. The symmetry of the second measurement site $41_2$, the third measurement site $41_3$, the fourth measurement site $41_4$, and the fifth measurement site $41_5$ is exploited in order to estimate the proximity effects.

Figure 5:
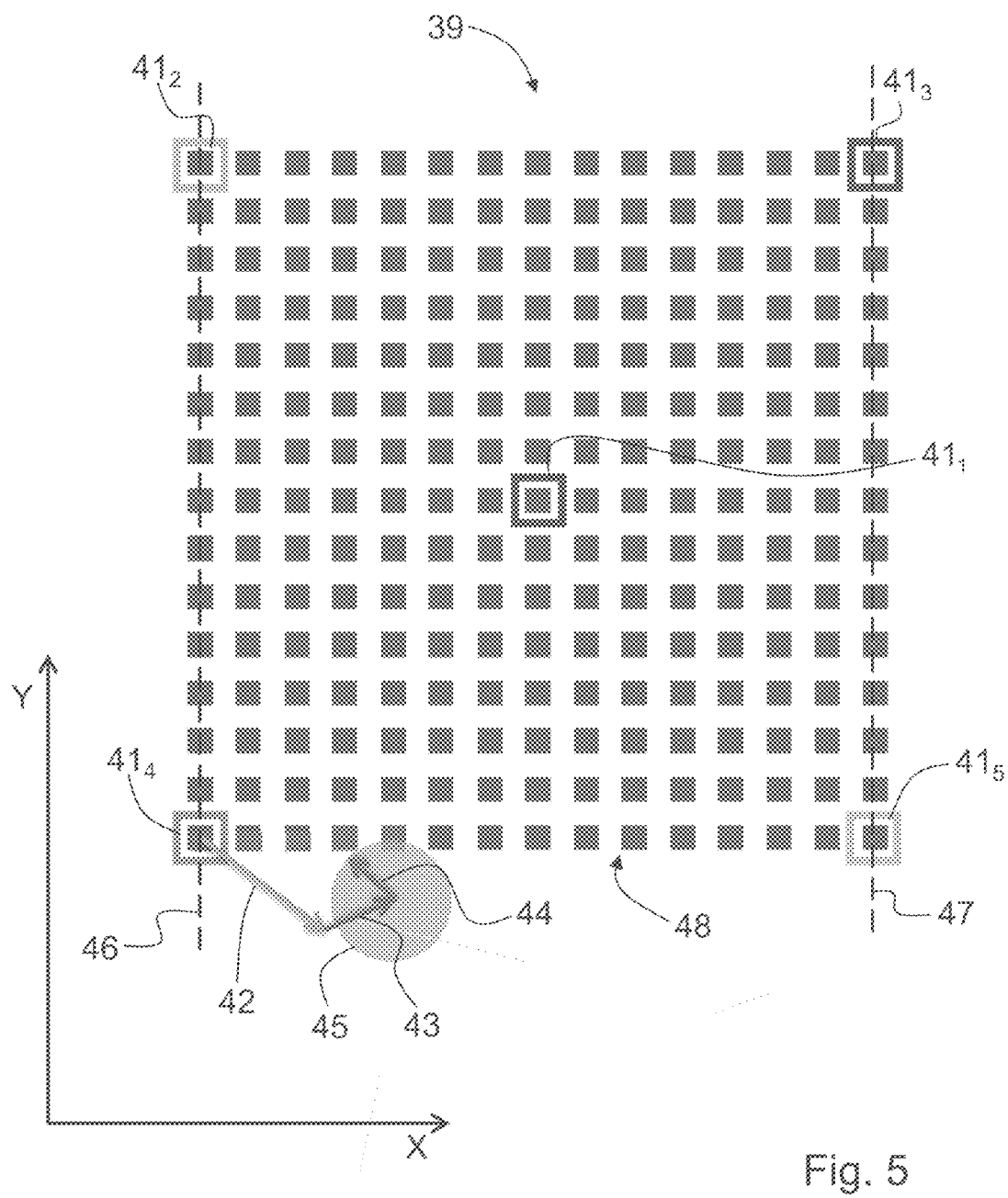
FIG. 5 is a schematic representation of various error contributions to the measured position of the fourth measurement site of the contact array.

FIG. 5 is a schematic representation of various error contributions to the measured position of the fourth measurement site $41_4$ of the contact array 39. For any array, the measurement result at the first measurement site $41_1$, the second measurement site $41_2$, the third measurement site $41_3$, the fourth measurement site $41_4$ or the fifth measurement site $41_5$ is represented by measured positions of the respective site in the X coordinate direction and the Y-coordinate direction. Consequently, the component $X^4$ of the position of the fourth measurement site $41_4$ in the X-direction is determined by:

$$X^4 = \mu^4_{Mask} + \mu^4_{IPRO} \pm \sigma_{Random}$$

The measured position of the fourth measurement site $41_4$ is influenced by a first error component 42 ($\mu_{mask}$) which results from the pattern placement shift during the production process of a mask. A second error component 43 ($\mu_{IPRO}$) results from a metrology induced shift. A third error component 44 ($\mu_{Random}$) results from mask and metrology components. The third error component 44 is of constant size but can have an orientation from 0° to 360°. This fact is illustrated by a circle 45 in FIG. 5.

The first error component 42 for the fourth measurement site $41_4$ is defined as follows:

$$\mu^4_{mask} = \mu^4_{global} + \mu^4_{local}$$

$\mu_{global}$ is the mask error over the contact array 39 and $\mu_{local}$ is a local error at the respective measurement site.

The second error component 43 for the fourth measurement site $41_4$ is defined as follows:

$$\mu^4_{IPRO} = \mu^4_{TIS} + \mu^4_{Prox}$$

$\mu_{TIS}$ is the "Tool Induced Sift" (TIS) of the measured position of the measurement sites 41 of the contact array 39 and $\mu^4_{Prox}$ is the proximity error of the respective measurement sites 41. $\mu_{TIS} \approx 0$ because all measurements of the measurement sites 41 are carried out at 0° (initial orientation) and 180° (degree of rotation of the initial orientation).

In the X-direction $\mu_{Prox} = \mu^5_{Prox} = \mu^3_{Prox} = -\mu^2_{Prox} = -\mu^4_{Prox}$ and $\mu^1_{Prox} \leq 0$. This means that due to the symmetry of the whole contact array 39 the proximity errors at the fifth measurement site $41_5$ and the third measurement site $41_3$ are identical, and up to a sign identical to the proximity errors at the second measurement site $41_2$ and at the fourth measurement site $41_4$. The proximity error at the first measurement site $41_1$, which is located in the center of the contact array 39, is close to zero.

Additionally, the global mask error, $$\mu^5_{global} = \mu^4_{global} = \mu^3_{global} = \mu^2_{global} = \mu^1_{global}$$

measured at the first measurement site $41_1$, the second measurement site $41_2$, the third measurement site $41_3$, the fourth measurement site $41_4$ and the fifth measurement site $41_5$, is constant over contact array 39.

The relative proximity error $\hat{\mu}^4_{Prox}$ in the X-direction between the fourth measurement site $41_4$ and the first measurement site $41_1$ (central measurement site 41 in the contact array 39) is determined by:

$$\hat{\mu}^4_{prox} = X^4 - X^1$$

Under consideration of the above equations:

$$\hat{\mu}^4_{Prox} = \mu^4_{Mask} + \mu^4_{Prox} \pm \sigma_{Random} - \mu^1_{Mask} - \mu^1_{Prox} \pm \mu_{Random}$$

Since the proximity error $\mu^1_{Prox}$ of the first measurement site $41_1$ is approximately zero, the above equation simplifies as follows:

$$\hat{\mu}^4_{Prox} = \mu^4_{Prox} + (\mu^4_{Local} - \mu^1_{Local}) \pm \sqrt{2} \times \sigma_{Random}$$

An estimate of the mask contribution to the proximity effect $e_{Prox}$ at the fourth measurement site $41_4$ is defined as follows:

$$e^4_{Prox} = (\mu^4_{Local} - \mu^1_{Local}) \pm \sqrt{2} \times \sigma_{Random}$$

The average proximity error $\hat{\mu}_{Prox}$ for the second measurement site $41_2$, the third measurement site $41_3$, the fourth measurement site $41_4$ and the fifth measurement site $41_5$ is determined as follows:

$$\hat{\mu}_{Prox} = \frac{\hat{\mu}^5_{Prox} + \hat{\mu}^3_{Prox} - \hat{\mu}^4_{Prox} - \hat{\mu}^2_{Prox}}{4} = \mu_{Prox} + e_{Prox}$$

The overall proximity error $e_{Prox}$ is as follows:

$$e_{Prox} = \frac{\mu^5_{Local} + \mu^3_{Local} - \mu^4_{Local} - \mu^2_{Local}}{4} \pm \frac{\sqrt{2} \times \sigma_{Random}}{\sqrt{4}}$$

The two equations above show the estimate of mask contribution to the proximity effect for one single contact array 39. The measurement is carried out on multiple contact arrays 39 (distributed on a test mask or a production mask).

$$e_{Prox} = \frac{\mu^5_{Local} + \mu^3_{Local} - \mu^4_{Local} - \mu^2_{Local}}{4} \pm \frac{\sqrt{2} \times \sigma_{Random}}{\sqrt{4} \times \sqrt{\#DIES}}$$

The derivation of the proximity effect $e_{Prox}$ uses the symmetry of the arrangement of measurement sites 41 in the contact arrays 39. According to the arrangement of measurement sites 41 (see FIG. 5) the term $(\mu^5_{Local} - \mu^4_{Local})$ represents the difference in the mask manufacturing process between the left side 46 and the right side 47 of the bottom 48 of the contact array 39. Such a difference might arise from so-called e-beam writer charging effects (see for example reference "Modeling of charging effect and its correction by EB mask writer EBM-6000"). From a purely analytical point of view, the described measurement scheme cannot separate between the metrology tool proximity error, $\mu_{Prox}$, and the asymmetries in the mask manufacturing process as represented by $(\mu^5_{Local} - \mu^4_{Local})$. However, as shown above it is possible to either:

Make use of prior knowledge to estimate the mask manufacturing asymmetry. A registration measuring algorithm, such as the "edge algorithm" (see FIG. 8A), does not correct for proximity effects. The "model-based registration algorithm" (see FIG. 8B), then strongly suggests that the model-based registration algorithm is indeed correcting most of the proximity error.

According to the assumption that the model-based registration algorithm is indeed correcting the proximity error, one can estimate the asymmetry in the mask manufacturing process.

Figure 6:
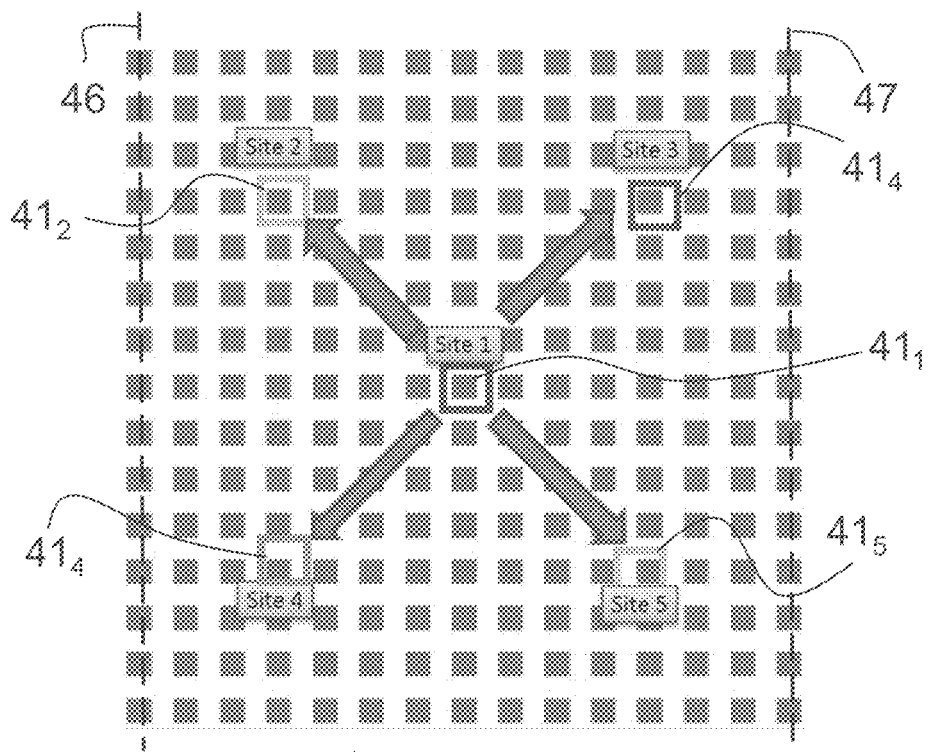
FIG. 6 is a schematic representation of a variation of the measurement scheme.

FIG. 6 shows a variant of the scheme to determine the influence of the proximity effect. Behavior of $\hat{\mu}_{Prox}$ is determined as the distance between the second measurement site $41_2$, the third measurement site $41_3$, the fourth measurement site $41_4$ and the fifth measurement site $41_5$ and the first measurement site $41_1$ (central site) gradually increases. The mask metrology proximity error and the mask manufacturing error change at different rates so more information about the relative values of the proximity error and the manufacturing error can be derived.

Figure 7:
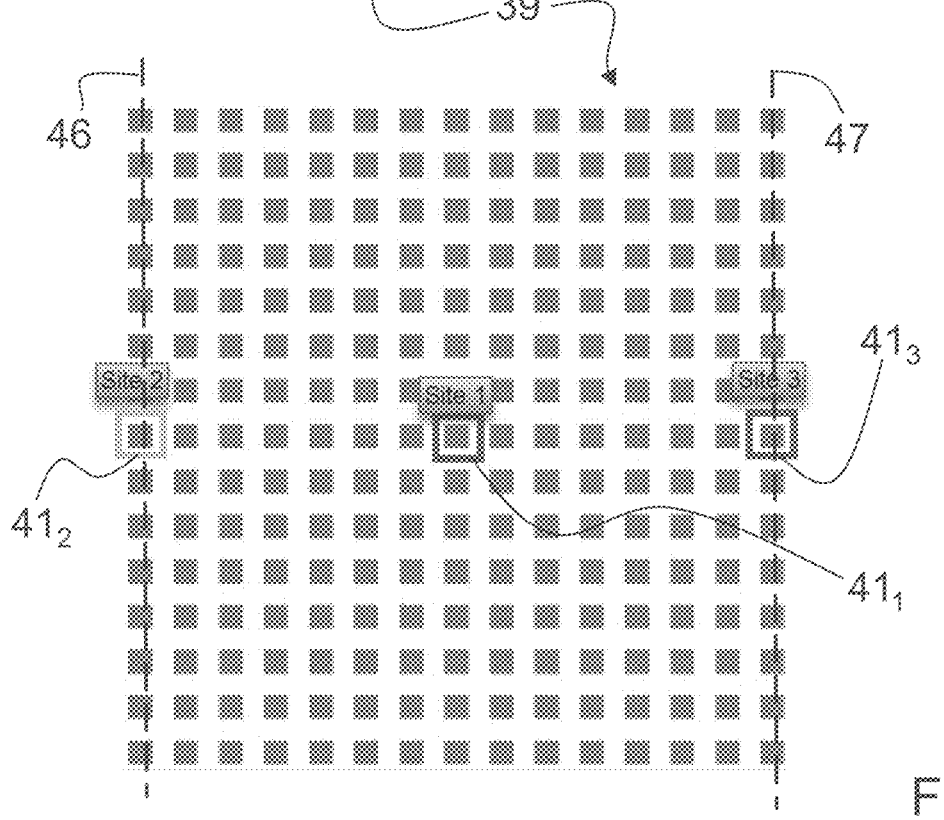
FIG. 7 is a schematic representation of a further variation of the measurement scheme.

FIG. 7 shows a further variant of the scheme to determine the influence of the proximity effect. Here three measurement sites 41 are use to determine the proximity effect $\hat{\mu}_{Prox}$. The first measurement site $41_1$ (central site) is positioned in the center of the contact array 39. A second measurement site $41_2$ and a third measurement site $41_3$, are positioned at the left side 46 and the right side 47 of the contact array 39, respectively The proximity effect $\hat{\mu}_{Prox}$ which has no metrology tool proximity error is defined as follows:

$$\hat{\mu}_{Prox} = \frac{\hat{\mu}^3_{Prox} + \hat{\mu}^2_{Prox}}{2}$$
$$= \frac{(\mu^3_{Local} - \mu^1_{Local}) + (\mu^2_{Local} - \mu^1_{Local})}{2} + \sigma_{random}$$

The above equation expresses a different mask manufacturing asymmetry. It is clear for a skilled person that many more relationships can be established between measured quantities, metrology tool proximity error, and mask manufacturing asymmetries. None of them solves the fundamental problem of separating proximity error from manufacturing errors, but in conjunction with suitable algorithms they provide a practical approach to measuring and correcting mask manufacturing errors. There are some other important variations for the arrangement and the design of the measurement sites. A change of the relative locations of the measurement sites give an insight how proximity errors and manufacturing asymmetries develop from the center of the contact array 39 to the edges of the contact array 39.

Figure 8A:
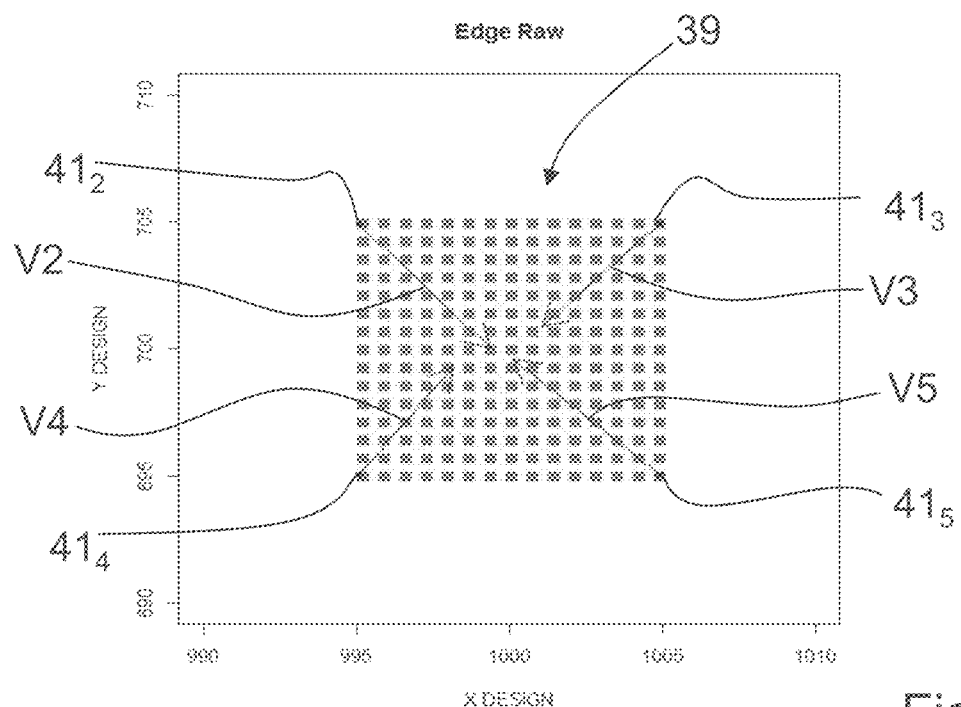
FIG. 8A is a representation of the measured position value of the four measurement sites located at the corner, as in FIG. 5, with reference to the position value of the measurement site in the center of the symmetric contact array.

FIG. 8A is a representation of the measured position value of the four measurement sites $41_2$, $41_3$, $41_4$, $41_5$ located at the corners of the contact array 39 (see FIG. 5) with reference to a position value of measurement site $41_1$ in the center of the symmetric contact array 39. A vector V2 is assigned to the second measurement site $41_2$, which indicates the displacement of the measured position of the second measurement site $41_2$ in relation to the position based on mask data of the second measurement site $41_2$. The measured position of the second measurement site $41_2$ is shifted towards the first measurement site $41_1$ in X-coordinate and Y-coordinate direction.

A vector V3 is assigned to the third measurement site $41_3$, which indicates the displacement of the measured position of the third measurement site $41_3$ in relation to the position based on mask data of the third measurement site $41_3$. The measured position of the third measurement site $41_3$ is shifted towards the first measurement site $41_1$ in X-coordinate and Y-coordinate direction.

A vector V4 is assigned to the fourth measurement site $41_4$, which indicates the displacement of the measured position of the fourth measurement site $41_4$ in relation to the position based on mask data of the fourth measurement site $41_4$. The measured position of the fourth measurement site $41_4$ is shifted towards the first measurement site $41_1$ in X-coordinate and Y-coordinate direction.

A vector V5 is assigned to the fifth measurement site $41_5$, which indicates the displacement of the measured position of the fifth measurement site $41_5$ in relation to the position based on mask data of the fifth measurement site $41_5$. The measured position of the fifth measurement site $41_5$ is shifted towards the first measurement site $41_1$ in X-coordinate and Y-coordinate direction.

Figure 9A:
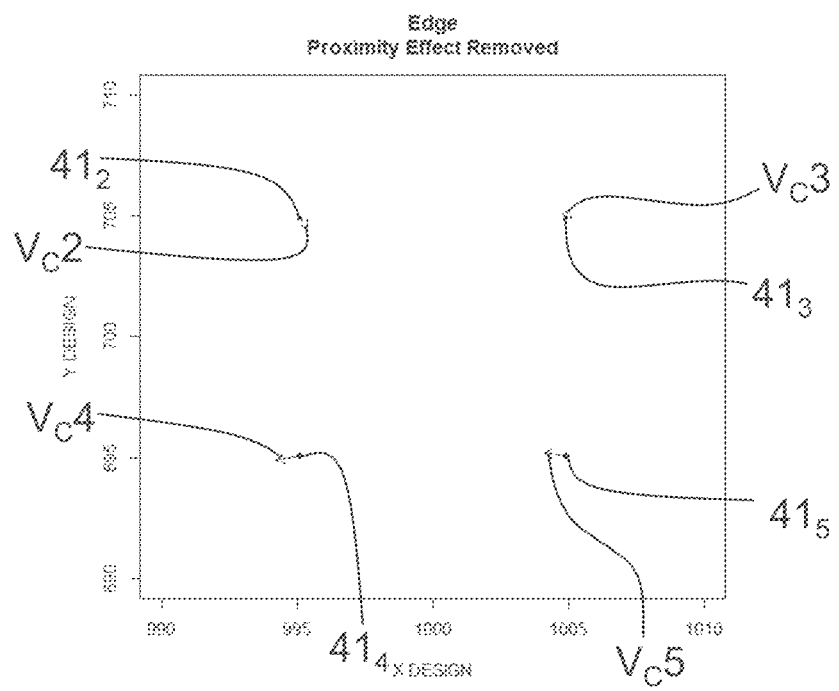
FIG. 9A is a representation of the measured position of the four measurement sites located at the corners in X-direction and Y-direction with the proximity effect, as in FIG. 8A, removed.

FIG. 9A is a representation of the measured position of the four measurement sites $41_2$, $41_3$, $41_4$, $41_5$ located at the corners in X-direction and Y-direction, wherein the proximity effect (see FIG. 8A) is removed. For the present case the average proximity effect $\hat{\mu}_{Prox}$ is 3.99 nm in the X-direction and 4.40 nm in the Y-direction. After subtracting the average proximity effect $\hat{\mu}_{Prox}$ in the X-direction and in the Y-direction from each vector V2, V3, V4 and V5 one obtains corrected vectors $V_c2$, $V_c3$, $V_c4$ and $V_c5$. The corrected vectors $V_c2$, $V_c3$, $V_c4$ and $V_c5$ the stand for position measurements, wherein the optical proximity error is removed.

Figure 8B:
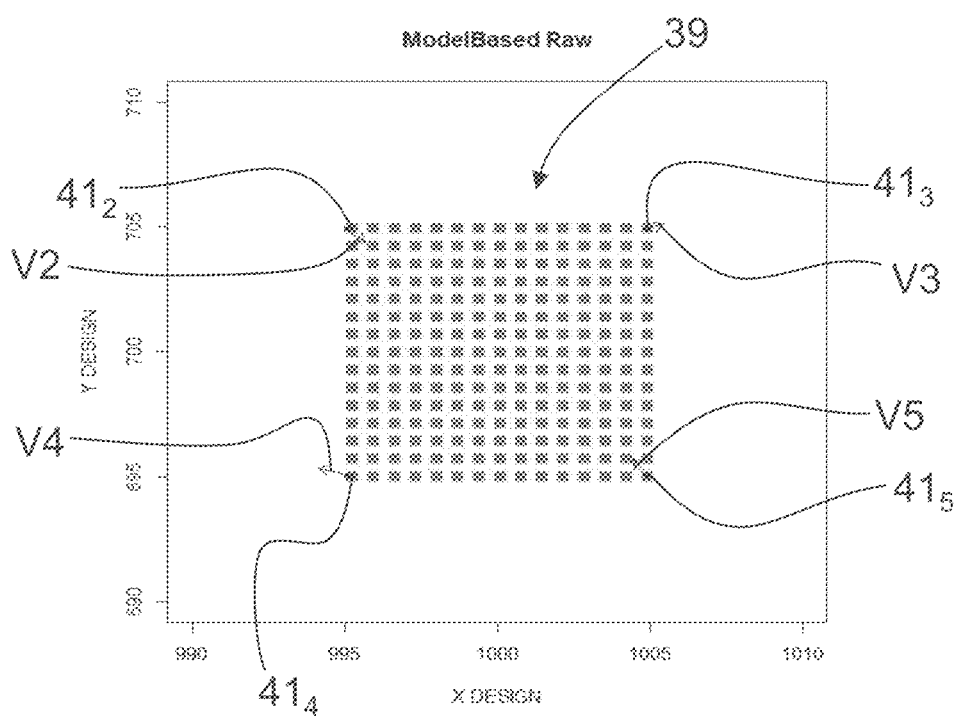
FIG. 8B is a representation of the measured model-based position value of the four measurement sites located at the corner, as in FIG. 5, with reference to the model-based position value of the measurement site in the center of the symmetric contact array.
Figure 9B:
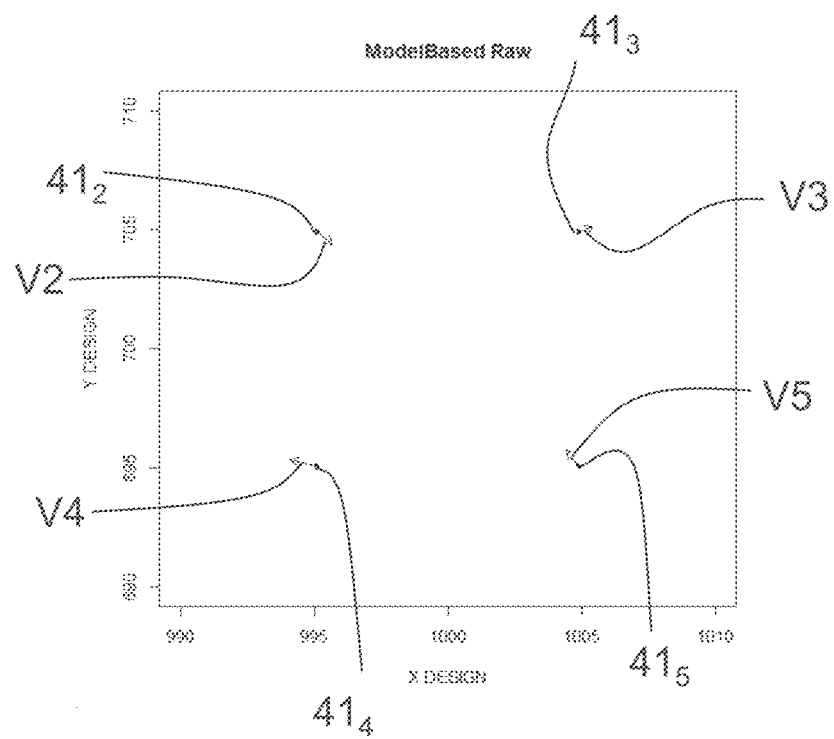
FIG. 9B is a representation of the model based position of the corner sites in the X-direction and the Y-direction.

FIG. 8B is a representation of the measured model-based position value of the four measurement sites $41_2$, $41_3$, $41_4$, $41_5$ located at the corners of the contact array 39 (see FIG. 5) with reference to a model based position value of measurement site $41_1$ in the center of the symmetric contact array 39. The model-based algorithm for simulating an optical image of the contact array 39 (a functional pattern on a mask) involves simulating the expected image using a model of the imaging system and the model data of the contact array 39 on the mask, which are stored in a database of a computer system. Registration is computed by minimizing a metric of dissimilarity, or equivalently, maximizing a metric of similarity of the acquired optical image and the simulated image. For example, a metric of dissimilarity of two images is the L2-norm of pixel-by-pixel differences of two images. A metric of similarity of two images is their correlation. In the preferred implementation, multiple images at different focus settings are acquired and simulated. The difference of the optical and simulated images is computed for each pixel and each focus value. In an embodiment, the registration mismatch for each site is simultaneously computed with other parameters such as focus. In an embodiment, the model of the imaging system includes aberrations. In another embodiment, a low aberration objective is used and aberrations are ignored in the model. In another embodiment, aberrations are ignored in the model, and optical images are acquired at two orientations of the mask. The two orientations differ by a 180° degree rotation in the plane of the mask. Combining either the optical images or measured registration from the optical images significantly reduces the effect of aberrations on registration measurements (position measurements). Compared to the measurement result of FIG. 8A the deviation vector V2 of the second measurement site $41_2$, the deviation vector V3 of the third measurement site $41_3$, the deviation vector V4 of the fourth measurement site $41_4$, and the deviation vector V5 of the fifth measurement site $41_5$ are smaller. FIG. 9B is a representation of the measured position determined with the use of the model-based algorithm for the four measurement sites $41_2$, $41_3$, $41_4$, $41_5$ located at the corners of the mask. For the present case, the average proximity effect $\hat{\mu}_{Prox}$ is 0.12 nm in the X-direction and 0.31 nm in the Y-direction.

The table below shows the result of the edge based measured proximity effect and the measured model-based proximity effect in the X-direction of the contact array shown in FIG. 5.

| $\mu_{Prox}$ [nm] | Edge based 1 contact | Model based 1 contact |
|---|---|---|
| second measurement site | 4.27 | 0.59 |
| third measurement site | −3.84 | 0.56 |
| fourth measurement site | 3.09 | −0.97 |
| fifth measurement site | −4.76 | −0.46 |
| Average* | 3.99 | 0.12 |
| $\sim e_{Prox}$ | +/−0.8 nm | |

The table below shows the result of the edge based measured proximity effect and the measured model-based proximity effect in the Y-direction of the contact array shown in FIG. 5.

Wherein * is defined as:

$$\hat{\mu}_{Prox} = \frac{\hat{\mu}_{Prox}^5 + \hat{\mu}_{Prox}^3 - \hat{\mu}_{Prox}^4 - \hat{\mu}_{Prox}^2}{N}$$

| $\mu_{Prox}$ [nm] | Edge based 1 contact | Model based 1 contact |
|---|---|---|
| second measurement site | −4.85 | −0.53 |
| third measurement site | −4.03 | 0.21 |
| fourth measurement site | 4.21 | 0.26 |
| fifth measurement site | 4.54 | 0.65 |
| Average* | 4.40 | 0.31 |
| $\sim e_{Prox}$ | +/−0.8 nm | |

It is clear from the above measurement, that the edge based algorithm for the determination of the position of structures shows a proximity effect impact of ~4 nm.

The rotation of a symmetric pattern layout (see contact array 39 of FIG. 5) leads to similar proximity effect in the X-direction and the Y-direction.

With the model-based algorithm it is possible to remove the optical proximity effect.

Figure 10:
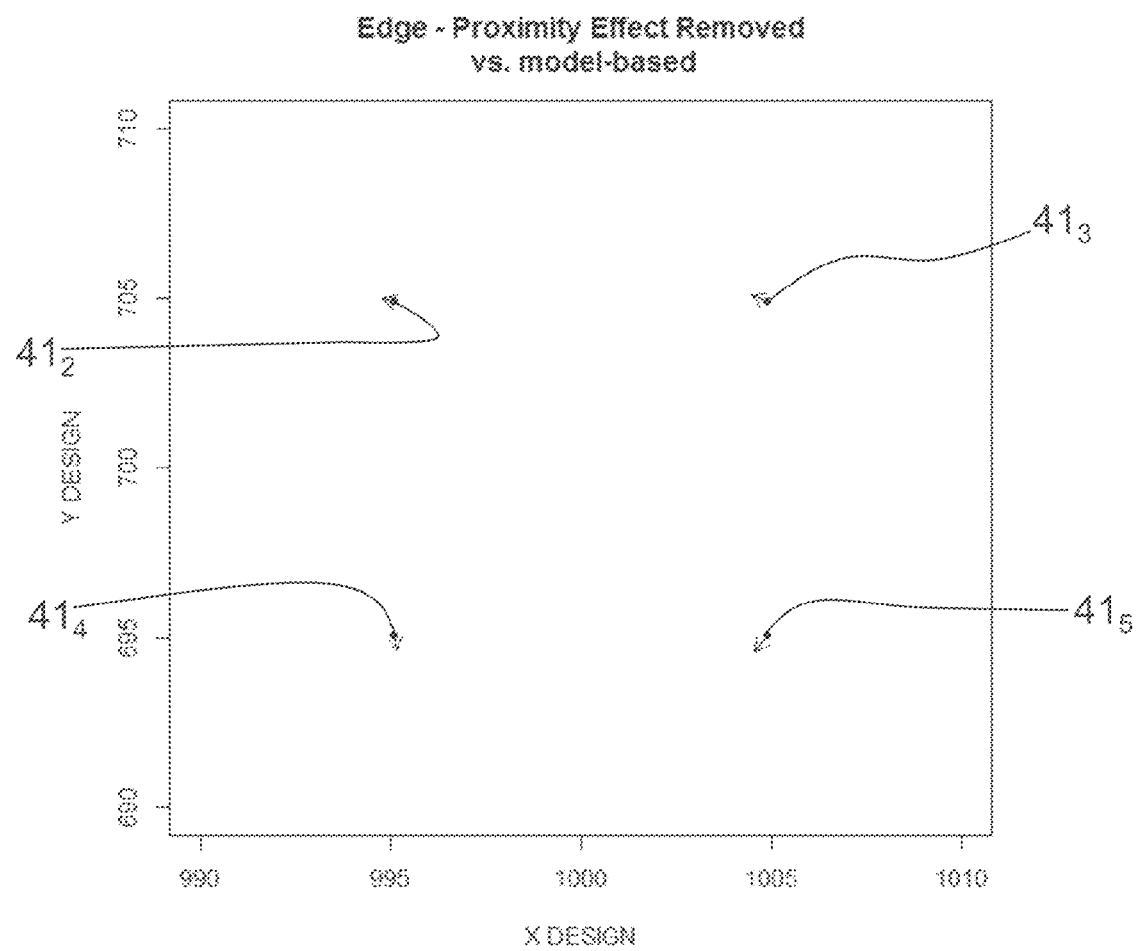
FIG. 10 is a representation of the position deviation of the corner sites calculated from the measured position and the model-based position of the corner sites in the X-direction and the Y-direction.

FIG. 10 is a representation of the position deviation of the four measurement sites $41_2$, $41_3$, $41_4$, $41_5$ calculated from the optical proximity effect corrected measured position and the measured model-based position in the X-direction and the Y-direction. For the present case the average remaining proximity error $e_{Prox}$ is +/−0.8 nm in the X-direction and +/−0.8 nm in the Y-direction. Due to the small difference between the edge based measurement and the model-based measurement of the position of the measurement sites, both measurement schemes capture the same local mask pattern displacement.

Figure 11A:
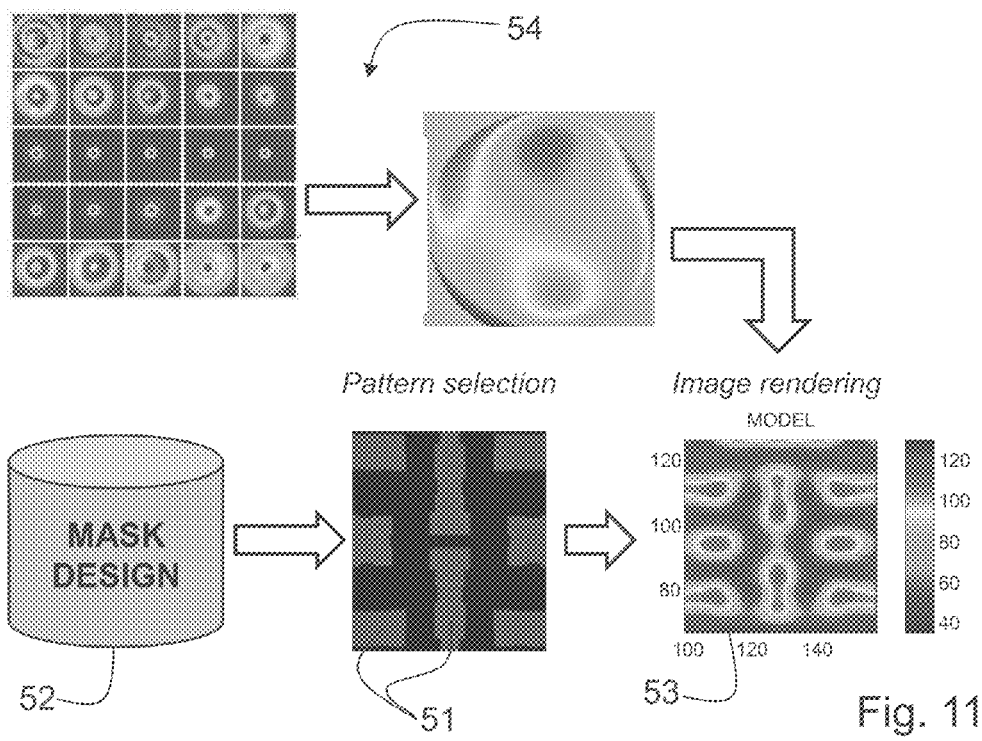
FIG. 11A is a graphical representation of model-based determination of the position of selected structures on a mask.

FIG. 11A is a graphical representation of the model-based determination of the position of selected structures 51 on a mask. A customer or user chooses from a mask design 52 database the measurement sites which have the selected structures 51. Furthermore, the algorithm can search the database for suitable structures/patterns and sort/suggest the list for the customer/user. On the selected structures 51 of the mask design data an image rendering is carried out. Accordingly, at least one rendered image 53 of the mask design data is obtained. The image rendering step can include, according to a further embodiment, as well the optical aberration model 54 of the measurement objective 9 which is used to capture at least one image of the selected structures on the mask. A stack of rendered images may be calculated by using the optical aberration model at different focus positions. The resulting rendered image can be a single image, a stack of N images, or an average of the stack of N rendered images.

Figure 11B:
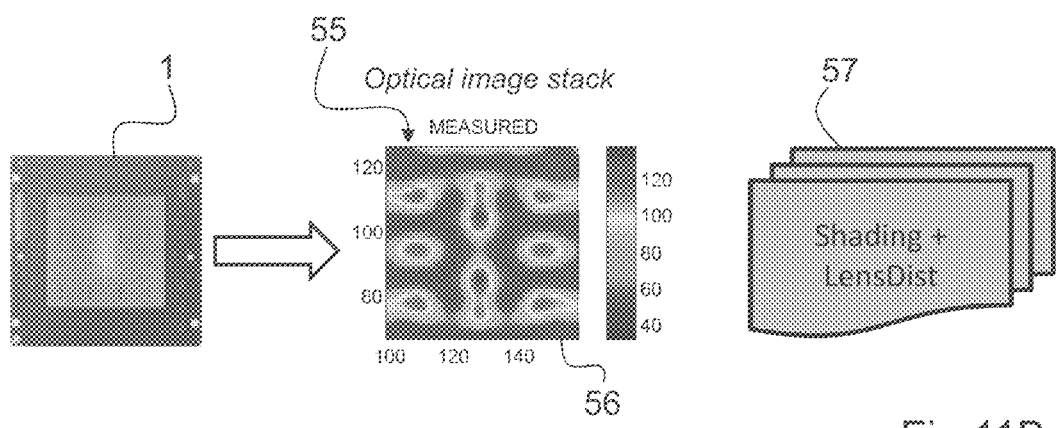
FIG. 11B is a graphical representation of the measured position of selected structures of the same mask design pattern as used in FIG. 11A; and, FIG. 12 is a graphical representation of a residual generated from the theoretical calculation of the position of a selected mask design pattern and the measured position of the selected mask design pattern.

FIG. 11B is a graphical representation of the measured position of selected structures of the same mask design 52 pattern as used in FIG. 11A. First of all, the measuring table of the metrology tool is moved in a plane parallel to a surface of the mask 1, thereby placing an area of the mask in a field of view 55 of the imaging system of the metrology tool. The area of the mask is located at a position on the mask which corresponds to the position of the structures for which mask design 52 data have been selected for the image rendering step. At least one optical image 56 is captured of the structures/pattern with the imaging system of the metrology tool within the area on the mask. A shading and lens distortion correction 57 is carried out on each of the captured optical images 56.

Figure 12:
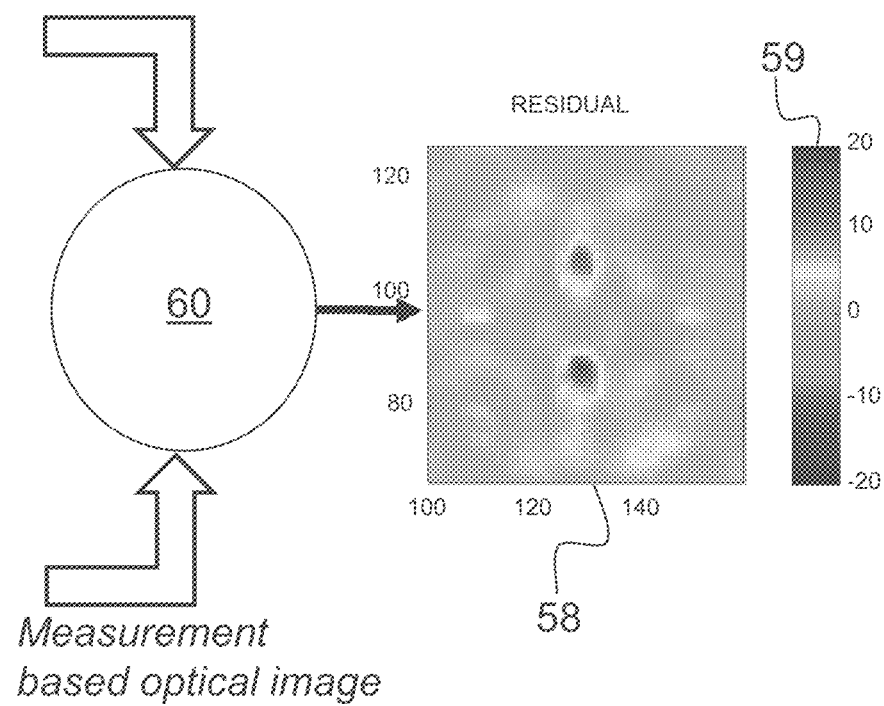

FIG. 12 is a graphical representation of a residual image generated from the theoretical calculation of the position of selected structures from mask design 52 data and the measured position of the structures corresponding to these selected structures. A difference 60 between the mask design based reference image 53 and the measurement based optical image 56 results in a residual image 58. A scale 59, displayed together with the residual image, provides information about a deviation measure of the structures at specific locations within the field of view. Since the influence of the optical proximity effect in the X-direction and the Y-direction is within the accuracy of the metrology tool, the residual image gives a clear indication of the remaining or detected deviations in the X-direction and the Y-direction as based on errors in the mask production process.

The invention has been described with reference to preferred embodiments. It is, however, known to the skilled person that alterations and modifications are possible without leaving the scope of the subsequent claims.

LIST OF REFERENCE NUMERALS 1 mask
2 substrate
3 structure
$3_1$ first structure
$3_2$ second structure
5 reflected light illumination axis
6 transmitted light illumination system
7 deflecting mirror
8 condenser
9 measuring objective
10 camera
11 detector
12 beam-splitting mirror
13 chromium layer
14 reflected light illumination system
15 displacing device
16 computer system
17 field of view
18 measurement window
19 distance
20 measuring table
21 air bearings
23 light beam
24 laser interferometer
25 massive element
25a plane in X-coordinate direction and Y-coordinate direction
26 oscillation dampers
30 overall electronic signal
31 electronic signal
32 electronic signal
33 maximum value
34 half value
35 pattern shift
$36_{11}, \ldots, 36_{NM}$ dies
38 arrangement of measurement sites
39 contact array
40 optical arrangement
41 measurement sites
$41_1$ first measurement site
$41_2$ second measurement site
$41_3$ third measurement site
$41_4$ fourth measurement site
$41_5$ fifth measurement site
42 first error component
43 second error component
44 third error component
45 circle
46 left side of contact array
47 right side of contact array
48 bottom of contact array
50 optical arrangement
51 selected structures
52 mask design
53 rendered image
54 optical aberration model
55 field of view
56 optical image
57 shading and lens distortion correction
58 residual image
59 scale
100 metrology tool
V2 vector
V3 vector
V4 vector
V5 vector
$V_c2$ corrected vector
$V_c3$ corrected vector
$V_c4$ corrected vector
$V_c5$ corrected vector
X X-direction
Y Y-direction

What is claimed is:

1. A method for measuring positions of structures on a mask and thereby determining mask manufacturing errors comprising:
    determining from a plurality of measurement sites an influence of an optical proximity effect on a position measurement of structures on the mask, with a metrology tool;
    selecting an area on the mask from mask design data which contains a data representation of the structures to be measured by the metrology tool;
    carrying out an image rendering of the data representation of the structures, wherein at least one rendered image of the mask design data is obtained;
    moving a measuring table of the metrology tool in a plane parallel to a surface of the mask and thereby placing an area of the mask in a field of view of an imaging system of the metrology tool, wherein the area of the mask is located at a position on the mask which corresponds to a position of the area on the mask selected from mask design data;
    capturing at least one optical image of a pattern within the area of the mask with the imaging system of the metrology tool; and, determining a residual from an at least one rendered image of the structures according to the mask design data and an at least one optical image of the structures on the area on the mask.

2. The method of claim 1, wherein the influence of the optical proximity effect on a position measurement with the metrology tool is determined from at least one arrangement of measurement sites, wherein a first measurement site is surrounded by identical sites and at least a second measurement site and at least a third measurement site are located at opposite edges of the arrangement of measurement sites.

3. The method of claim 2, wherein the arrangement of measurement sites has one first central site, and a second measurement site, a third measurement site, a fourth measurement site, and a fifth measurement site are positioned at corners of the arrangement of measurement sites.

4. The method of claim 2, wherein a plurality of arrangements of measurement sites are formed on a test mask.

5. The method of claim 2, wherein a plurality of dies is formed on a production mask and some of the plurality of dies have an arrangement of measurement sites, wherein the arrangement of measurement sites is a contact array.

6. The method of claim 1, wherein a proximity error, which includes an optical proximity error, of the measured position of each of at least two of the plurality of measurement sites is determined by an optical measurement of at least two of the plurality of measurement sites with an optical system of the metrology tool.

7. The method of claim 1, wherein the influence of the optical proximity effect on a measured position of each of at least two measurement sites of a plurality of measurement sites is determined by:

carrying out an image rendering of a data representation of each of the at least two measurement sites, wherein at least one rendered image of the mask design data of the at least two measurement sites is obtained;

capturing at least one optical image of the at least two measurement sites on a second mask at a position identical to a position of the measurement sites of the mask design data; and, subtracting the at least one rendered image from the optical image.

8. The method of claim 1, wherein the image rendering is also carried out on mask design data which are rotated by 180°.

9. The method of claim 1, wherein the capturing of at least one optical image is carried out with a 180°-rotated mask.

10. The method of claim 1, wherein the residual is an arithmetic average of a difference between at least one rendered image and at least one corrected optical image.

11. The method of claim 10, wherein the residual is a color-coded graphical representation of a deviation of the position of the structures in a X-direction and a Y-direction within a field of view and the deviation is based solely on mask manufacturing errors.

12. The method of claim 1, wherein each of the at least one optical image is subjected to an image correction.

13. The method of claim 12, wherein the image correction corrects a shading and a lens distortion.

* * * * *